(12) United States Patent
Handy et al.

(10) Patent No.: US 7,423,286 B2
(45) Date of Patent: Sep. 9, 2008

(54) LASER TRANSFER ARTICLE AND METHOD OF MAKING

(75) Inventors: Erik S. Handy, Arlington, MA (US); Joseph Michael Kunze, Chelmsford, MA (US); Peter T. Kazlas, Sudbury, MA (US)

(73) Assignee: SI2 Technologies, Inc., Chelmsford, MA (US)

( * ) Notice: Subject to any disclaimer, the term of this patent is extended or adjusted under 35 U.S.C. 154(b) by 453 days.

(21) Appl. No.: 10/935,461

(22) Filed: Sep. 7, 2004

(65) Prior Publication Data

US 2005/0054121 A1 Mar. 10, 2005

Related U.S. Application Data

(60) Provisional application No. 60/500,795, filed on Sep. 5, 2003.

(51) Int. Cl.
*H01L 23/58* (2006.01)
*H01L 29/10* (2006.01)

(52) U.S. Cl. ............... 257/48; 257/431; 257/E21.134; 257/433; 257/414; 257/E21.456; 257/E23.148; 438/3; 438/15; 438/16; 438/48

(58) Field of Classification Search ............ 438/3
See application file for complete search history.

(56) References Cited

U.S. PATENT DOCUMENTS

| | | | |
|---|---|---|---|
| 4,756,633 A | 7/1988 | Drees et al. | |
| 4,897,310 A | 1/1990 | Beyer et al. | |
| 5,654,811 A * | 8/1997 | Spitzer et al. | 349/106 |
| 5,941,674 A | 8/1999 | Briehl | |
| 6,060,127 A | 5/2000 | Tatah et al. | |
| 6,114,188 A * | 9/2000 | Oliver et al. | 438/107 |
| 6,159,832 A | 12/2000 | Mayer | |
| 6,183,588 B1 | 2/2001 | Kelly et al. | |
| 6,848,162 B2 * | 2/2005 | Arneson et al. | 29/458 |
| 6,872,635 B2 | 3/2005 | Hayashi et al. | |
| 6,887,650 B2 | 5/2005 | Shimoda et al. | |
| 7,166,559 B2 * | 1/2007 | Odamura et al. | 503/227 |
| 2001/0048083 A1 * | 12/2001 | Hagiwara | 250/492.22 |
| 2002/0098668 A1 | 7/2002 | Kim et al. | |
| 2003/0199157 A1 | 10/2003 | Kim et al. | |

(Continued)

FOREIGN PATENT DOCUMENTS

DE 4232373 A 3/1994

(Continued)

*Primary Examiner*—Walter Lindsay, Jr.
*Assistant Examiner*—Abdulfattah Mustapha
(74) *Attorney, Agent, or Firm*—Pepper Hamilton LLP (57) ABSTRACT

The present invention is directed to methods for transferring pre-formed electronic devices, such as transistors, resistors, capacitors, diodes, semiconductors, inductors, conductors, and dielectrics, and segments of materials, such as magnetic materials and crystalline materials onto a variety of receiving substrates using energetic beam transfer methods. Also provided is a consumable intermediate comprising a transfer substrate and a transfer material coated thereon, wherein the transfer material may be comprised of pre-formed electronic devices or magnetic materials and crystalline materials that may be transferred to a variety of receiving substrates. Aspects of the present invention may also be used to form multi-device electronic components such as sensor devices, electro-optical devices, communications devices, transmit-receive modules, and phased arrays using the consumable intermediates and transfer methods described herein.

17 Claims, 8 Drawing Sheets

U.S. PATENT DOCUMENTS

2005/0287315 A1 * 12/2005 Kreilich et al. .......... 428/32.81

FOREIGN PATENT DOCUMENTS

| FR | 2666759 A | 3/1992 |
| JP | 2002311858 A1 | 10/2002 |
| WO | WO 0044960 A1 | 1/2000 |
| WO | WO 0072222 A1 | 5/2000 |
| WO | WO 03/101171 A1 | 12/2003 |

* cited by examiner

LASER TRANSFER ARTICLE AND METHOD OF MAKING

GOVERNMENT INTERESTS

This invention was made with Government support under contracts DASG60-02-C-0039 and DAAH01-03-C-R223 awarded by the U.S. Army Space and Missile Defense Command and U.S. Army Aviation and Missile Command. The Government has certain rights in the invention.

BACKGROUND

Fabrication in the semiconductor and electronics industries relies on material transfer techniques. Semiconductor device transfer, for example, may be accomplished by a process of mounting and mechanically dicing semiconductor wafers to singulate the devices, followed by a device transfer step using a robotic "pick-and-place" system.

Another process of transferring components supported by a carrier to a desired position on a substrate is described in U.S. Pat. No. 5,941,674, herein incorporated by reference. This process includes moving a carrier including an electronic component to a pick-up position and using an ejector pin such that the component is lifted from the carrier. Simultaneously, a pick-up element is moved towards the component from a site of the carrier remote from the pin, such that the component is picked up by said element by means of vacuum. The component is then moved to a desired position on a substrate by the pick-up element. Such a method is suitable for components whose length and/or width are greater than approximately 0.25 mm and whose thickness is greater than, for example, 70 μm.

Another process suitable for transferring an electronic component supported by a carrier to a desired position on a substrate is described in PCT Patent Application International Publication No. WO 03/101171 A1, herein incorporated by reference. In this process, the carrier supporting the component is moved relative to the substrate while the component is present on a side of the carrier facing the substrate. Then a light beam is directed at the carrier, at the location of the component, from a side remote from the substrate, as a result of which a connection between the component and the carrier is broken and the component is transferred from the carrier to the substrate.

Direct fabrication of miniaturized and rugged electronic devices on a variety of substrates permits rapid prototyping of device concepts and reduced product development design cycle times, and could be used to reduce costs in the manufacturing of such devices. Flexible substrates are particularly attractive for possible roll-to-roll processing of electronic devices (like film based microelectrode sensors arrays), and for processing chemical and biological materials at electronically addressed micro-locations, a variety of displays, and communication devices. Some workers have deposited thin films of amorphous silicon on plastic substrates, for example, but had to subsequently laser-anneal the patterned silicon to render it polycrystalline for high performance devices. Using so-called "fluidic self assembly" (FSA) techniques, multi-device electronic components have been made by repeatedly flowing liquid suspensions of microparticles (individually patterned with single transistors or integrated circuits) over substrates with specially-shaped indentations. The microparticles fit into the indentations to form the completed device. However, this process relies on statistics and requires special equipment.

The term "direct write" refers generally to any technique for creating a pattern directly on a substrate, either by adding or removing material from the substrate, without the use of a mask or preexisting form. Direct write technologies have been developed in response to a need in the electronics industry for a means to rapidly prototype passive circuit elements on various substrates, especially in the mesoscopic regime; that is, electronic devices that straddle the size range between conventional microelectronics (sub-micron-range) and traditional surface mount components (10+ mm-range). Direct writing allows for circuits to be prototyped without iterations in photolithographic mask design and allows the rapid evaluation of the performance of circuits too difficult to accurately model. Since most direct write processes operate in ambient environment, high-rate production processes (such as roll-to-roll and sheet-to-sheet processes) can be enabled for electronic components that previously had to be processed in batches under controlled environments such as vacuum. Further, direct writing allows for the size of printed circuit boards and other structures to be reduced by allowing passive circuit elements to be conformably incorporated into the structure. Direct writing can be controlled with CAD/CAM programs, thereby allowing electronic circuits to be fabricated by machinery operated by unskilled personnel or allowing designers to move quickly from a design to a working prototype. Other applications of direct write technologies in microelectronics fabrication include forming ohmic contacts, forming interconnects for circuit and device restructuring, and customization.

In the direct writing technique known as "laser induced forward transfer" (LIFT), a pulsed laser beam is directed through a laser-transparent target substrate to strike a film of material coated on the opposite side of the target substrate. The laser-irradiated film of material vaporizes or ablates as it absorbs the laser radiation and, due to the transfer of momentum, the material is removed from the target substrate and is redeposited on a receiving substrate that is placed in proximity to the target substrate. Laser induced forward transfer is typically used to transfer opaque thin films (e.g., metals) from a pre-coated laser transparent support (typically glass, $SiO_2$, $Al_2O_3$, $SrTiO_3$, etc.) to the receiving substrate.

Because the film material is vaporized by the action of the laser, laser induced forward transfer is inherently a homogeneous, pyrolytic technique and typically cannot be used to deposit complex crystalline, multi-component materials or materials that have a crystallization temperature well above room temperature because the resulting deposited material will be a weakly-adherent amorphous coating. Moreover, because the material to be transferred is vaporized, it becomes more reactive and can more easily become degraded, oxidized or contaminated. The method is not well suited for the transfer of organic materials, since many organic materials are fragile and thermally labile and can be irreversibly damaged during deposition. For example, functional groups on an organic polymer can be irreversibly damaged by direct exposure to laser energy. Other disadvantages of the laser induced forward transfer technique include poor surface-coverage uniformity, morphology, adhesion and resolution. Further, because of the high temperatures involved in the process, there is a danger of ablation or sputtering of the support which can cause the incorporation of impurities in the material that is deposited on the receiving substrate. Another disadvantage of laser induced forward transfer is that it typically requires that the coating of the material to be transferred be a thin coating, generally less than 1 micron thick. Because of this requirement, it is very time-consuming to transfer more than very small amounts of material.

To avoid direct vaporization of the material to be transferred, the following variation of the laser induced forward transfer technique may be employed. The laser-transparent substrate is coated with several layers of materials, or with a coating that is a mixture of the material of interest in a matrix of other materials. In this layered approach, the outermost layer (that is, the layer closest to the receiving substrate) consists of the material to be deposited and the innermost layer consists of a material that absorbs laser energy and becomes vaporized, causing the outermost layer to be propelled against the receiving substrate. Matrix assisted pulsed laser evaporation direct write (MAPLE-DW) is one technique which utilizes this approach and has been used to transfer materials such as metals, ceramics, and polymers onto polymeric, metallic, and ceramic substrates at room temperature. A disadvantage of this method is that, because many materials were present on the laser-transparent substrate, it is difficult to achieve a highly homogeneous coating of the material of interest. A homogeneous coating would be required, for example, for the construction of electronic devices, sensing devices or passivation coatings.

Currently, the most advanced generation of semiconductor devices employs geometries of 0.13 microns with ~100 nm gate lengths and ~1.5 nm gate oxide thicknesses. Integrated circuit (IC) devices with these feature sizes (and associated high-performance) cannot be fabricated using direct write technologies. However, this is not problematic in that the IC device fabrication infrastructure is already well-established.

Devices are normally transferred via "pick and place" robotic systems. Pick and place systems typically transfer die that are pre-packaged in a rectangular plastic "lead frame" with metallic legs, i.e., such as the die visible on the motherboard in your computer. Pick and place systems may also handle so-called "bare" or "unpackaged" die. There is a need to develop methods that may be used to transfer a large number of devices on a flexible or curved substrate without having to reposition the wafer. A pick and place system can only transfer one device at a time, and cannot handle putting devices across a large area with high accuracy.

Therefore, there is a need for materials and methods for rapidly transferring pre-fabricated electronic devices and unpatterned electronic materials (including single layers and multiple layers of these devices and materials) to flexible and curved substrates with retention of device/material properties. There is a need for a process that makes use of off-the-shelf wafers based on crystalline Si, wafers with buried layers (such as silicon-on-insulator (SOI) wafers), and high-performance such as, GaAs, SiGe and InP wafers.

There remains a need to provide rapid transfer of pre-formed devices in electronic fabrication. There remains a need to develop materials and methods in which a consumable intermediate may be used in fabrication, especially in late-stage processing. Because the costs of fabricating/building on a flexible or curved substrate are very high, there remains a need to transfer a pre-formed device onto a flexible or curved substrate as a late-stage processing step.

SUMMARY

Using energetic beam transfer methods, pre-formed electronic devices, such as transistors, resistors, capacitors, diodes, semiconductors, inductors, dielectrics, conductors, as well as segments of magnetic materials and crystalline materials may be transferred onto a variety of receiving substrates. A transfer substrate and pre-formed electronic devices placed thereon may be formed into a consumable intermediate, which may be employed in a transfer process to transfer the pre-formed electronic devices to a variety of receiving substrates. The methods of the present invention may also be used to manufacture multi-device electronic components such as sensor devices, electro-optical devices, communications devices, transmit-receive modules, and phased arrays.

One embodiment of the present invention is a method of transferring devices or segments of magnetic materials and crystalline materials to a receiving substrate from a transfer substrate. The transfer material comprises one or more components selected from the group consisting of pre-formed electronic devices, transistors, resistors, capacitors, diodes, semiconductors, inductors, conductors, magnetic materials, dielectrics, crystalline materials, and combinations thereof. The method steps comprise providing the transfer substrate, providing the receiving substrate, and exposing the transfer substrate to an energy source at a defined location to transfer a component away from the transfer substrate toward the receiving substrate, wherein the component is transferred to the surface of the receiving substrate facing the transfer substrate.

Another embodiment of the present invention is a method of transferring devices to a receiving substrate from a composite transfer sheet comprised of a transfer substrate, one or more dynamic release layers, and a transfer material, wherein the one or more dynamic release layers is positioned on the transfer substrate on a surface facing a receiving substrate, and wherein the transfer material is positioned on a surface of the dynamic release layer facing the receiving substrate. The transfer material comprises one or more components selected from the group consisting of pre-formed electronic devices, transistors, resistors, capacitors, diodes, semiconductors, inductors, conductors, magnetic materials, dielectrics, crystalline materials, and combinations thereof. The steps comprise providing the composite transfer sheet, providing the receiving substrate, and exposing the composite transfer sheet to an energy source through the transfer substrate at a defined location to transfer a component away from the transfer substrate toward the receiving substrate, wherein the transfer material is deposited onto the surface of the receiving substrate facing the transfer substrate.

In the method embodiments of the present invention, the transfer material may include one or more devices used in a multi-device electronic component, a transmit-receive module, a communications device, a sensor device, phased arrays, or an electro-optical device. In the method embodiments of the present invention, the transfer substrate, the receiving substrate and the energy source may be translated with respect to each other using computer control. In the method embodiments of the present invention, the transfer material may have a thickness of about 0.1 nanometer to about 1 millimeter. In the method embodiments of the present invention, the transfer material and the receiving substrate may be about 0-300 microns apart when the transfer substrate is exposed to an energy source. In the method embodiments of the present invention, the energy may be supplied by a laser source selected from the group consisting of $CO_2$ lasers, excimer lasers, Ti:sapphire lasers, semiconductor lasers, dye lasers, copper vapor lasers, and Nd:YAG lasers or by an electron beam or ion beam. In the method embodiments of the present invention, the transfer substrate may be a transparent material, such as a polyimide ribbon film.

In the method embodiments of the present invention, the receiving substrate may be rigid, flexible, curved, both rigid and curved or both flexible and curved. The receiving substrate may be selected from the group consisting of polymers, glass, hybrids of polymers and glass, polymer composites, stainless steel, metallic foils, cellulosic materials, ceramics and woven materials. The receiving substrate may comprise a polysiloxane, polyalkylene, polyarylene, polyurethane, polyamide, polyacetylene, epoxy, liquid crystal polymer, amino plastic, polysulfide, polyester, polyether, polycarbonate, polyacrylate, polysulfone, polyimide, or composites or copolymers or combinations thereof.

In the method embodiments of the present invention, the transfer material may be a semiconductor wafer, which comprises a material selected from the group consisting of silicon, silicon germanium, germanium, gallium arsenide, gallium phosphide, gallium antimonide, gallium nitride, indium phosphide, indium arsenide, indium antimonide, silicon carbide, silicon-on-insulator, sapphire, quartz, glass, ZnO, and combinations thereof.

In the method embodiments of the present invention, the transfer material may directly contact the transfer substrate, may be directly fabricated or etched into a semiconductor wafer mounted to a transfer substrate, may be connected to the transfer substrate by an adhesive, may be contained within one or more coatings on the transfer substrate, or may be applied to one or more dynamic release layers coated on the transfer substrate.

If a dynamic release layer is used, the dynamic release layer remains substantially attached to the transfer substrate even after the transfer material has been transferred to the receiving substrate, absorbing the energy source and effectuating transfer. The one or more dynamic release layers may comprise a material selected from the group consisting of organic materials, thin metal films, metal oxides, metal sulfides, polymers, metal alloys, and mixtures thereof. In the method embodiments of the present invention, an adhesive layer and/or a dynamic release layer may be interposed in between the transfer material and the transfer substrate.

Another embodiment of the present invention is a composite transfer sheet for use in a transfer process to transfer one or more transfer materials from the composite transfer sheet to a receiving substrate, wherein said composite transfer sheet is designed to be a consumable intermediate in a transfer process. The composite transfer sheet comprises a transfer substrate, one or more dynamic release layers coated onto one surface of the transfer substrate, and a transfer material, wherein the transfer material is located on the dynamic release layer. The transfer material comprises one or more components selected from the group consisting of pre-formed electronic devices, transistors, resistors, capacitors, diodes, semiconductors, inductors, conductors, magnetic materials, dielectrics, crystalline materials, and combinations thereof.

Another embodiment of the present invention is a composite transfer sheet for use in a transfer process to transfer one or more devices from the composite transfer sheet to a receiving substrate, wherein the composite transfer sheet is designed to be a consumable intermediate in a transfer process. The composite transfer sheet comprises a transfer substrate, at least one adhesive coating located on one surface of the transfer substrate, and a transfer material, wherein the transfer material is located on the adhesive coating. The transfer material comprises one or more components selected from the group consisting of pre-formed electronic devices, transistors, resistors, capacitors, diodes, semiconductors, inductors, conductors, magnetic materials, dielectrics, crystalline materials, and combinations thereof.

In the consumable intermediate embodiments of the present invention, one or more dynamic release layers may be present. The one or more dynamic release layers may comprise a material selected from the group consisting of organic materials, thin metal films, metal oxides, metal sulfides, polymers, metal alloys, and mixtures thereof. In the consumable intermediate embodiments, one or more adhesive coatings may be used to attach the transfer material to the substrate.

Another embodiment of the present invention is a multi-device electronic component comprising a receiving substrate having one or more devices placed on it, wherein at least one device is transferred to the receiving substrate by a transfer process. The transfer material comprises one or more components selected from the group consisting of pre-formed electronic devices, transistors, resistors, capacitors, diodes, semiconductors, inductors, conductors, magnetic materials, dielectrics, crystalline materials, and combinations thereof.

A multi-device electronic component of the present invention may be made by a transfer process with or without a dynamic release layer.

In one embodiment, individual devices (e.g. transistors, resistors, or capacitors) or circuits are formed or placed on a substrate that is preferably transparent to a source of energy. In contrast to the transfer steps, which transfer a pre-formed device, the devices themselves may be fabricated by conventional semiconductor processing techniques. Once fabricated, the devices may be placed onto a transfer substrate. As such, this fabrication of the devices may be carried out prior to the transfer steps, without the processing concerns related to fabrication on a flexible or curved substrate. As such fabrication of the electronic devices is efficient and inexpensive as compared to fabrication on a flexible substrate. Final transfer of a pre-formed device onto a flexible, rigid, or curved receiving substrate, which was not involved in the fabrication, may thus be accomplished by the transfer, without any damage to the receiving substrate. The fabrication may employs a higher resolution beam than the beam from the energy source used to subsequently transfer the formed devices.

In method embodiments, transferred pre-formed devices retain their functional properties following the transfer. In method embodiments, the transfer may be carried out at atmospheric pressure and at room temperature.

The present invention is useful for the deposition of integrated circuits on flexible and low glass transition temperature substrates such as polymers that are not traditionally amenable to integrated circuit manufacturing techniques.

Embodiments of the present invention obviate the need for multi-step material deposition and post-deposition processes to fabricate devices on flexible polymeric substrates, such as building transistors in layer-by-layer fashion (e.g., channel material, then implantation, then source and drain electrodes, then gate dielectric, etc.) on the substrate. Rather, the invention exploits established, high-volume, low-cost fabrication techniques used for building high-performance pre-fabricated devices. The invention simply transfers these pre-fabricated devices onto to a variety of substrates. The pre-fabricated devices may be commercially available silicon, GaAs, or other wafers with transistors or other electronic components. These transistors or other electronic elements can now be "punched" out of rigid substrates (e.g., wafers) and "printed" onto flexible substrates. In contrast to fluidic self-assembly techniques, the present invention facilitates liquid-free transfer of high-performance devices to a variety of substrates on which the device materials could not have originally been deposited and processed. These devices show higher performance than devices currently being pursued for use in flexible electronics (e.g., those based on organic semiconductors and polycrystalline or laser-recrystallized silicon).

DESCRIPTION OF THE DRAWINGS

In part, other aspects, features, benefits and advantages of the embodiments of the present invention will be apparent with regard to the following description, appended claims and accompanying drawings where:

DETAILED DESCRIPTION

Before the present compositions and methods are described, it is to be understood that this invention is not limited to the particular molecules, compositions, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to a "resistor" is a reference to one or more resistors and equivalents thereof known to those skilled in the art, and so forth. Unless defined otherwise, all technical and scientific terms used herein have the same meanings as commonly understood by one of ordinary skill in the art. Although any methods and materials similar or equivalent to those described herein can be used in the practice or testing of embodiments of the present invention, the preferred methods, devices, and materials are now described. All publications mentioned herein are incorporated by reference. Nothing herein is to be construed as an admission that the invention is not entitled to antedate such disclosure by virtue of prior invention.

The present methods are used to transfer a pre-formed electronic device onto a receiving substrate. The processes contemplate that the transfer steps may be used to assemble a of multiple-device electronic components, such as a transmit-receive module, a communications device, a sensor device, phased arrays, or an electro-optical device. The present methods may be used to transfer the individual electronic devices from a variety of substrates onto a final receiving substrate to arrive at the multiple-device electronic component, such as a transmit-receive module. Therefore a pre-formed electronic device such as an integrated circuit built into a silicon wafer using high-end lithographic and implantation processes may be transferred to a flexible receiving substrate. End products of the present invention include a rigid, flexible or curved transmit/receive (T/R) module, a rigid, flexible or curved phased array, a flexible circuit board, or the flexible backplane for a roll-out PDA display that consists of integrated circuits, capacitors, and resistors.

Thus, any number of components may be placed onto a receiving substrate to build a multi-device component, for example. As used herein the term "transfer material" may be used to describe a "layer" of material on the transfer substrate. The transfer material is comprised of one or more individual components to be transferred. These components may include a part of a wafer or semiconductor material to be transferred or a preformed device to be transferred or segments of crystalline materials or magnetic materials. As used herein the term "device" may denote a single device [e.g., an individual transistor, integrated circuit, low-noise amplifier, power amplifier, or microelectromechanical device (MEMs)]. A "multi-device component" may be a phased array, display backplane, photodetector, or T/R module, for example, which are made up of multiple devices transferred to a common substrate using the present methods.

Methods include the transferring of preformed electronic devices from a transfer substrate onto a receiving substrate in a specific pattern. The transfer substrate is preferably a laser transparent material, the said transfer material on a surface facing the receiving substrate. By exposing the transfer material to laser energy through the laser transparent substrate at a defined location, the transfer material is transferred away from the surface of the transfer substrate toward the receiving substrate, wherein the transfer material is transferred to the surface of the receiving substrate facing the transfer substrate.

The transfer material may be of amorphous as well as segments of crystalline or magnetic materials; preferably the amorphous or crystalline materials are in a preformed shape suitable for use in an complex circuitry, memory device, organic light-emitting diode (OLED) or other display device, communications device, sensor device, or an electro-optical device. More preferably the transfer material includes but is not limited to one or more preformed electronic devices such as transistors, resistors, capacitors, inductors, conductors, semiconductors, memory elements, dielectrics and combinations or portions thereof such as gate stack structures or diodes. The transfer material may include segments of crystalline or magnetic materials, such as tiles from a commercially available semiconductor wafer. The complex devices may be fabricated using standard integrated circuit manufacturing techniques, then transferred to a surface of the transfer substrate or they may be positioned on a sacrificial material on the transfer substrate. The transfer material may be configured into one or more layers on the transfer substrate. Such preformed devices are generally comprised of materials typical for electronic components, namely, silicon, silicon germanium, germanium, gallium arsenide, gallium phosphide, gallium antimonide, gallium nitride, indium phosphide, indium arsenide, indium antimonide, silicon carbide, silicon-on-insulator, sapphire, quartz, glass, ZnO, and combinations thereof, copper, lithium niobate, silicon dioxide, aluminum, indium tin oxide, silicides, and nitrides. The transfer material may comprise isolated "tiles", or die, such as in the case where devices from a singulated semiconductor wafer are being transferred. The thickness of the transfer material may be about 0.1 nanometers to about 1 millimeter.

Transfer materials may also include off-the-shelf wafers based on crystalline Si, wafers with buried layers (such as silicon-on-insulator (SOI) wafers), and high-performance such as, GaAs, SiGe and InP wafers. These wafers with the preformed devices may be thinned and transferred to a tape or other substrate suitable for use with a transfer process. The devices or circuits from the thinned substrate may be transferred to the receiving substrate using laser transfer. Additional materials to complete the circuits, such as conducting interconnects or insulators, may also be transferred to the receiving substrate by transfer from other transfer substrates.

The transfer substrate may be a substrate that is used in normal integrated circuit manufacturing. Examples of such substrates include but are not limited to glass, quartz, and polymeric materials. Preferably the substrate is transparent to the energy source. For example, if a laser beam is used, the transfer substrate may be a transparent polyimide film. Other materials may be preferred if an ion or electron beam supplies the energy. It may be preferable to mechanically or chemically thin or lap the backside of the transfer substrate opposite the transfer material to increase the transfer of energy to the material. If the thinned transfer substrate is mechanically weak it may be placed onto a laser transparent support film. The transfer substrate, like the receiving substrate, may be rigid or flexible.

Figure 2:
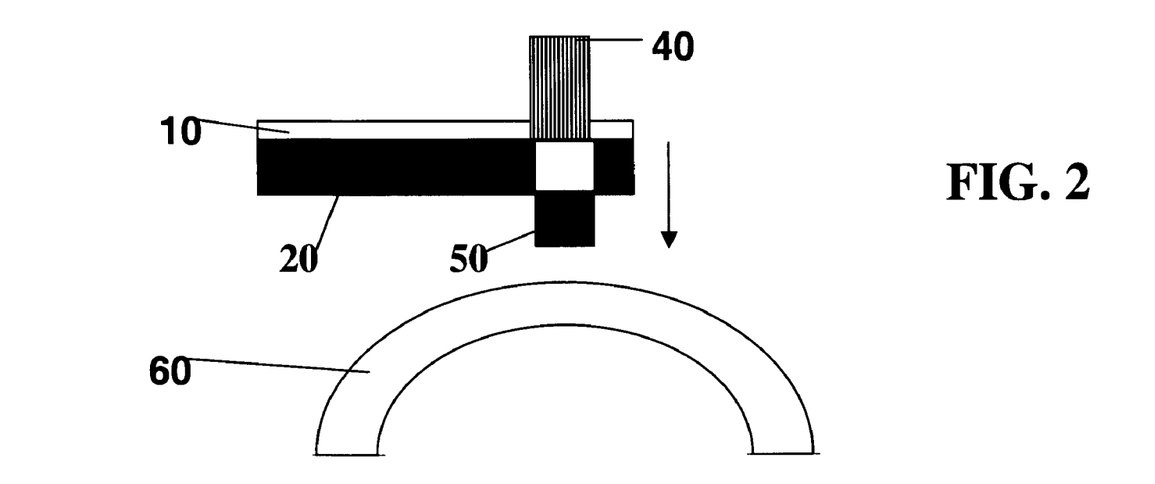
FIG. 2 is a side view schematic of one method of the present invention, wherein a single layer of material is transferred from a transparent substrate to a curved substrate.
Figure 3:
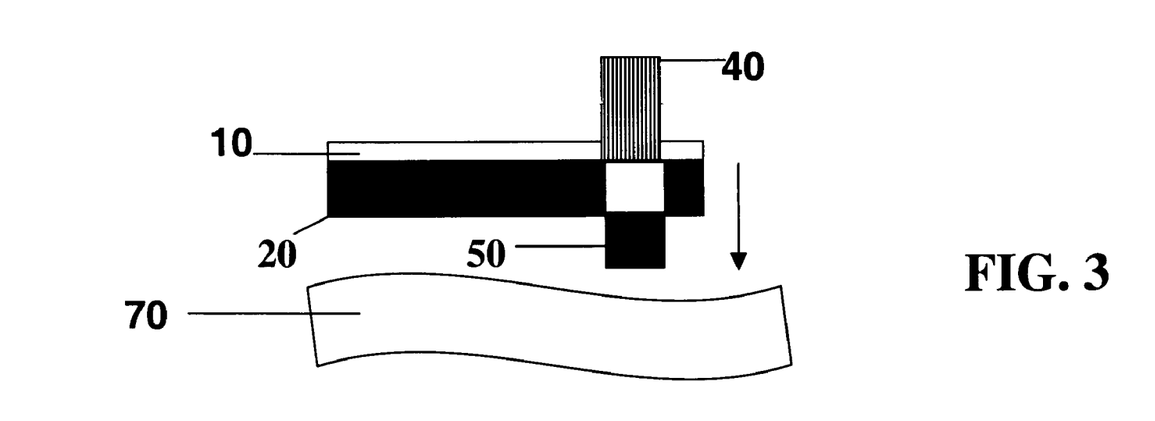
FIG. 3 is a side view schematic of one method of the present invention, wherein a single layer of material is transferred from a transparent substrate to a flexible substrate.

The receiving substrate may be a rigid or a flexible material. A rigid, planar substrate may be a glass or composite plate substrate. The receiving substrate may be planar or curved or curved and rigid, such as ceramic. The receiving substrate may be curved 60 as illustrated FIG. 2 and flexible 70 as illustrated in FIG. 3. The receiving substrate may be of a material selected from the group consisting of polymers, glass, hybrids of polymers and glass, polymer composites, stainless steel, metallic foils, cellulosic materials, ceramics and woven materials. Preferably the receiving substrate is a flexible transparent substrate such as glass or plastic films or hybrids thereof (e.g. polyesters, such as polyethylene terephthalate and polyethylene naphthalate, polycarbonate, polyacrylate, polysulfone and polyimide film and flexible glass). The substrate may be planar or it may have a sinusoidal or a curved surface such as but not limited to a cylinder or spherical surfaces. Other useful substrates may include but are not limited to those made from Kapton®, polyacrylic acid-butyl ester, polyethylene, poly(methacrylic acid)-methyl ester (PMMA), poly(methacrylic acid)-n butyl ester (PBMA), poly(methacrylic acid)-t butyl ester (PtBMA), polytetrafluoroethylene (PTFE), polyperfluoropropylene, poly N-vinyl carbazole, poly(methyl isopropenyl ketone), poly alphamethyl styrene, polyacrylic acid, polyvinylacetate or other similar polymer. Flexible non-conductive inorganic material, conductive sheets or foils, or polymer composites may also be used. The substrate may be coated with a conductive polymeric material.

Curved substrates may be made of polymeric materials, polymer composite materials, such as the ones described above and ceramic materials. The term "curved" refers to any non-planar or irregular surface, such as the curved shape of an aircraft fuselage or flight surface (e.g., wing, stabilizers, ailerons, etc.). This terminology is familiar to those in the art.

As stated above, the transfer material may be connected to the transfer substrate with the use of a sacrificial layer. Such layers are generally used and known in the art. The sacrificial material may be an adhesive, which may be a vaporizable substance. The sacrificial material may include vaporizable materials as well as energy absorbing materials to assist in the transfer process, layer that interacts with the laser source to effect transfer of the transfer material onto a receiving element at an energy/fluence less than would be required in the absence thereof. The adhesive is thought to release the transfer material by effectively eliminating the adhesive forces that bond or consolidate the transfer material with the transfer substrate, such as by changing its physical state, such as vaporization or melting, when it is exposed to the energy source. This causes a rapid and localized plume of material which projects the transfer material to receiving substrate. Examples of typical sacrificial materials include conventional adhesives, epoxy resins, polymers, electrical conductive glue, and energetic materials (such as nitrated molecules).

When transfer substrate having the transfer material on its surface intercepts the energy beam which impinges upon the first transfer substrate, energy is transferred to the transfer material which in turn releases the transfer material from the transfer substrate at the point of energy source impingement. The transfer material is then transferred to the surface of the second receiving substrate where it is deposited/placed in accordance with a pattern. While, methods may employ electronic or ion beams as the energy source, the present description will refer specifically to laser transfer.

Figure 1:
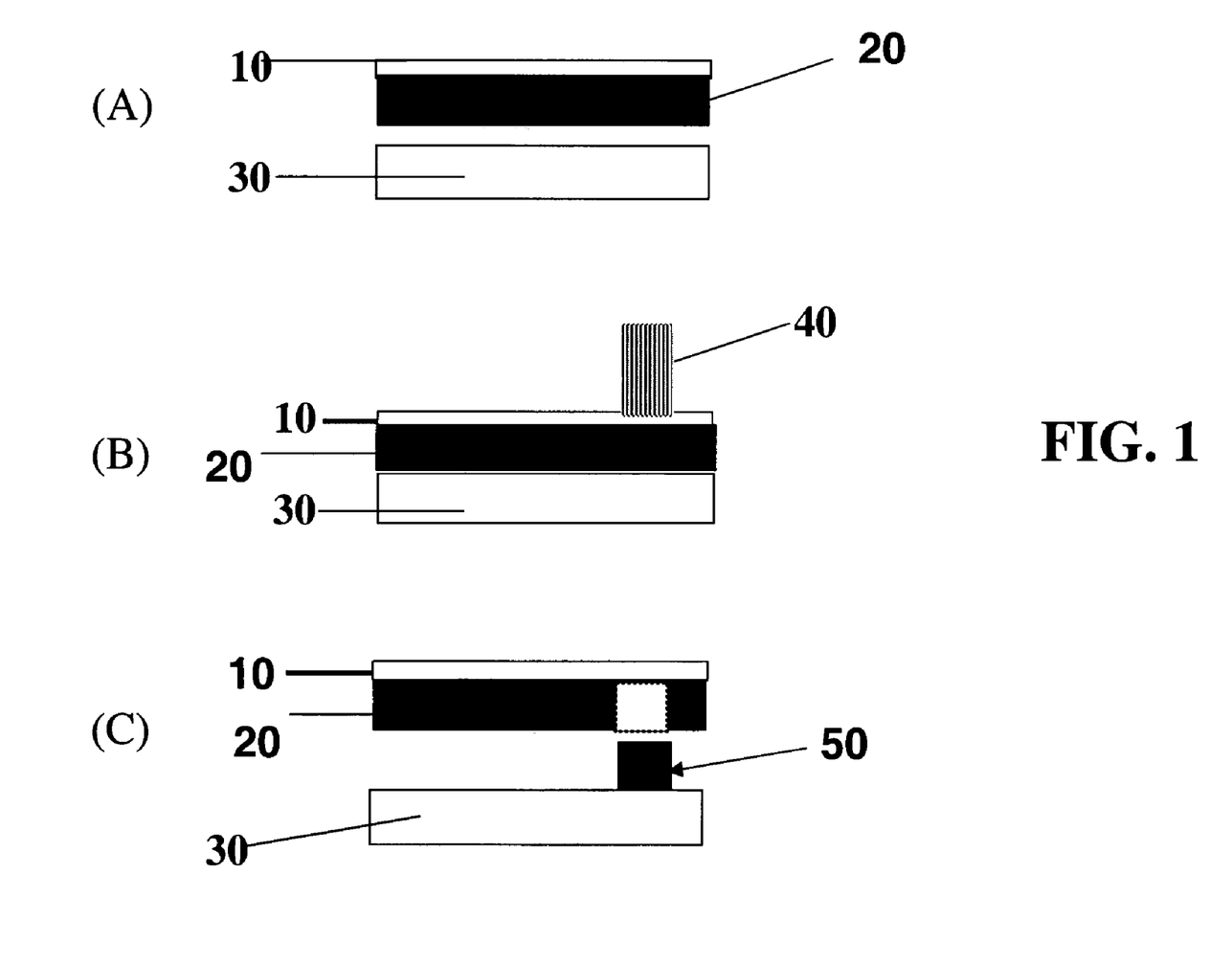
FIG. 1 is a side view schematic of one method of the present invention, wherein a single layer of material is transferred from a transparent donor substrate to a rigid, planar receiving substrate, such as a glass or composite plate.

This process is shown schematically in FIGS. 1-10 of the present invention, wherein in FIG. 1., the transfer and receiving substrates are in contact while the laser beam contacts the transfer substrate. In FIG. 1, the transfer material 20 is transferred from the transfer substrate 10 to the receiving substrate 30, which is initially (A) separated from the transfer substrate 10. In step B, the transfer substrate 30 contacts the transfer material 20, while the laser 40 strikes the transfer substrate at a defined location to transfer a device or segment of crystalline or magnetic material 50. In step C, the substrates 10 and 30 are separated, leaving the transferred device 50 on the surface of the substrate 30. One or both of the substrates may be translated for the next deposition or transfer step.

While the energy source strikes the transfer substrate, the distance between the two substrates will depend upon the thickness of the transfer material as well as process requirements of translating the substrates. As seen in FIGS. 2-8, the transfer material and receiving substrate may separated by a distance of up to about 300 microns during the laser transfer. The pattern on the receiving substrate may be formed by movement of the receiving substrate through use of CAD/CAM programs and controller. The pattern may also be achieved by movement or translation of the laser and/or the transfer substrate.

Different energy beams may be used in the processes of the present invention such as laser beams, ion beams, electron beams, a pulsed UV excimer laser, $CO_2$ beams, and a pulsed YAG laser in the infrared. Specific laser sources may include: $CO_2$ lasers, excimer lasers, Ti:sapphire lasers, semiconductor lasers, dye lasers, copper vapor lasers, and Nd:YAG lasers. The laser fluence of the laser beam(s) of the present invention may be adjusted so that the energy threshold for transfer of a preformed device is enough to cause cohesive failure of the adhesion forces between the transfer material and the transfer substrate, so that material transfer is possible. Preferably, the total laser fluence at the point of transfer is in the range of from about 50 to about 2000 mJ/cm$^2$. For example, beam spots from about 2-400 microns may be used. The energy per pulse may range from about 1 to about 50 mJ/pulse.

A control mechanism may control the source of the energy beam by changing relative position of the energy beam with respect to either substrate, by regulating size and shape of the cross-section of the energy beam, and by regulating the fluence or movement of the energy beam. The control mechanism may include a CAD/CAM system known to those skilled in the art and a computer, substrate, laser positioners, and substrate holders as would be known to those skilled in the art.

The receiving substrate may be positioned in a spaced relation to the transfer substrate so that the transfer material may be transferred to a defined location on the second substrate in an adherent manner and so that any optional sacrificial material, or decomposition products in the desorbed coating can migrate from the space between the receiving substrate and the target substrate.

The source energy may also be directed through a transparent region of the target substrate, i.e. a region not covered with transfer material, or the target substrate can be moved completely out of the way so that the energy beam strikes the receiving substrate. In this way the energy source can be made to directly interact with the receiving substrate or with material already deposited on the receiving substrate. This can be done, for example, to roughen the surface of the receiving substrate or to modify the composition and properties of materials that have already been deposited.

While the transfer process preferably occurs at atmospheric pressure and in ambient conditions, a purge of inert gas may be used to remove heat from the substrates and/or to reduce particles or gases generated in the vicinity of the substrates.

The methods of transfer may include the acts of providing a transfer substrate, a controllable energetic beam, such as but not limited to a laser beam, directed through the first substrate to a transfer material supported on a surface of the first substrate, and a control unit. The control unit may independently displace the one or both substrates or the energetic beam prior to material transfer from the first substrate onto the receiving substrate surface in accordance with a predetermined pattern. Standard CAM/CAD controllers, software, and translation stages may be used as would be known to one skilled the art for making a controllable system for movement of the energetic beam(s), the transfer substrate, and the receiving substrate.

Another method embodiment of the invention is a method of transferring devices to a substrate from a composite transfer sheet comprised of a transfer substrate, one or more dynamic release layers, and a transfer material, wherein the one or more dynamic release layer is positioned on the transfer substrate on a surface facing a receiving substrate, and wherein the transfer material is positioned on a surface of the dynamic release layer facing the receiving substrate, wherein the transfer material comprises one or more components selected from the group consisting of pre-formed electronic devices, transistors, resistors, capacitors, diodes, semiconductors, inductors, conductors, magnetic materials, dielectrics, crystalline materials, and combinations thereof. The use of a dynamic release layer 80 is illustrated in FIGS. 5-8. The dynamic release layer is coated onto the transfer substrate 10 and the transfer material 20 is positioned on the dynamic release layer 80. The device or segment of material to be transferred 50 may be transferred to a planar substrate 30 as in FIG. 5, a curved substrate 60 as in FIG. 6 or a flexible substrate 70 as in FIG. 7.

In embodiments wherein a dynamic release layer is used to transfer the transfer material, the transfer material may adhere to the dynamic release layer on the transfer substrate with an optional adhesive, such as the adhesive materials described above.

The use of a dynamic release layer has been described in connection with the graphic arts and printing industries. For example, U.S. Pat. Nos. 5,256,506 and 5,171,650, herein incorporated by reference in their entirety describe an imaging medium comprising a dynamic release layer for the transferring of colorants, magnetic materials, and fluorescent materials for color printing and color proofing applications. These patents, however have not contemplated the use of a dynamic release layer in the laser transfer of pre-formed electronic devices or crystalline or magnetic materials.

The "dynamic release layer" is intended as an intermediate layer that interacts with the laser source to effect transfer of the transfer material onto a receiving element at an energy/fluence less than would be required in the absence thereof. The dynamic release layer is thought to release the transfer material by effectively eliminating the adhesive forces that bond or consolidate the transfer material with the transfer substrate, such as by changing its physical state, such as vaporization or melting, when it is exposed to the energy source. This causes a rapid and localized plume of material which projects the transfer material to receiving substrate. While not wishing to be bound by theory, it appears that even though a portion of the DRL layer may be vaporized when it is exposed to an energy source, this portion most likely re-condenses onto the transfer substrate, causing the DRL to substantially remain on the transfer substrate after the transfer of the transfer material. The dynamic release layer (DRL) is at least one layer of any organic or inorganic material, or combination thereof, that absorbs at least a fraction of the laser energy sufficient to diminish the adhesion between the DRL (s) and the transfer material. Such material can be intrinsically absorbing, or sensitized to absorb wavelengths of the energy source.

Exemplary such absorbing materials suitable for the DRL include thin films of metals, metal oxides, and metal sulfides which effectively melt, vaporize or otherwise change physical state when exposed to an energy source and preferably have little or no toxicity, have low energy requirements for release and reflect as little of the imaging radiation as possible. Representative such metals are those metallic elements of Groups Ib, IIb, IIIa, IVa, IVb, Va, Vb, VIIa, VIIb, VIIb and VIII of the Periodic Table, as well as alloys thereof or alloys thereof with elements of Groups Ia, Ia, and IIIb, or mixtures of same. Particularly preferred metals include Al, Bi, Sn, In or Zn, and alloys thereof or alloys thereof with elements of Groups Ia, IIa and IIIb of the Periodic Table, or their mixtures. Suitable such metal oxides and sulfides are those of Al, Bi, Sn, In, Zn, Ti, Cr, Mo, W, Co, Ir, Ni, Pd, Pt, Cu, Ag, Au, Zr or Te, or mixtures thereof.

Other exemplary DRL materials include those that undergo a change in crystal structure upon exposure to an energy source, such as germanium or sensitized liquid crystal materials. Also exemplary are those materials described in U.S. Pat. Nos. 4,756,633 and 4,897,310.

Exemplary organic DRL materials comprise sublimable materials and monomeric and polymeric compounds which are intrinsically capable of absorbing imaging radiation, and/or monomeric and polymeric compounds which have been sensitized with black body or non-black body absorbers to impart the necessary absorbance. Representative monomeric compounds include metal phthalocyanines, metal dithiolenes, anthraquinones, etc., which may be, e.g., vacuum deposited in the form of a thin layer. Representative polymeric compounds include the polythiophenes, polyanilines, polyacetylenes, polyphenylenes, polyphenylene sulfides, polypyrroles, and derivatives or mixtures thereof.

Yet other exemplary DRL materials include the combination of any ablation sensitizer/absorber, e.g., any near infrared or visible light sensitizer, in at least one binder which need not be, but may be absorbing at the imaging wavelength, or a sensitized/absorbing binder alone. The thickness of the at least one dynamic release layer depends upon the material(s) selected therefor. For example, where a metal such as those discussed above is employed as the DRL, a thickness of about one monolayer of the metal to about 500 angstroms is preferred.

Figure 4:
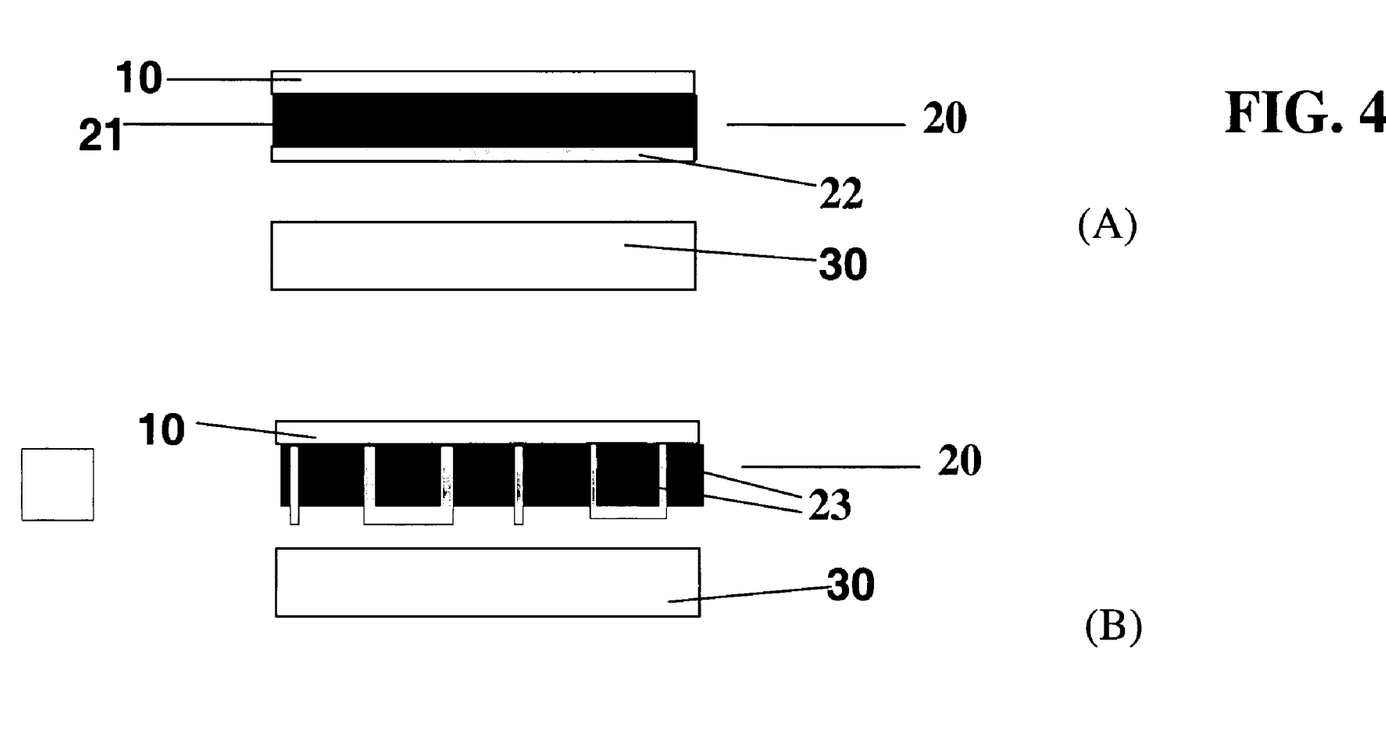
FIG. 4 is a side view schematic of one method of the present invention, wherein material to be transferred includes multiple layers (A) or includes isolated "tiles" or die (B).
Figure 5:
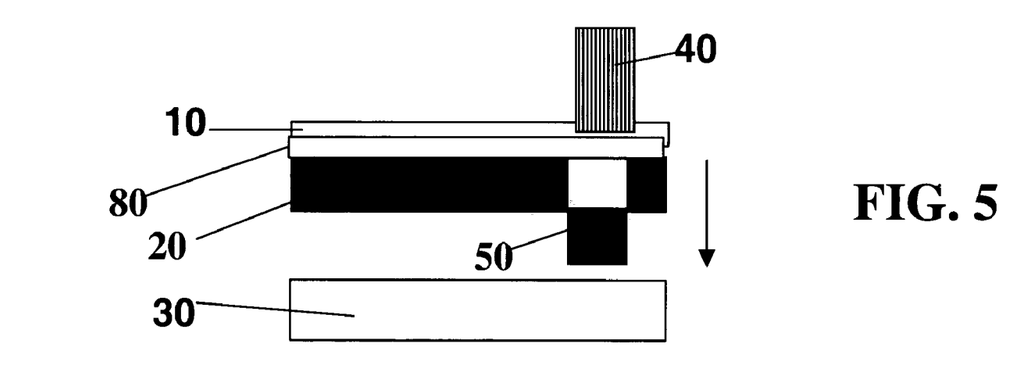
FIG. 5 is a side view schematic of one method of the present invention, wherein a single layer of material is transferred from a transparent substrate to a rigid, planar substrate such as a glass or composite plate using a dynamic release layer.
Figure 6:
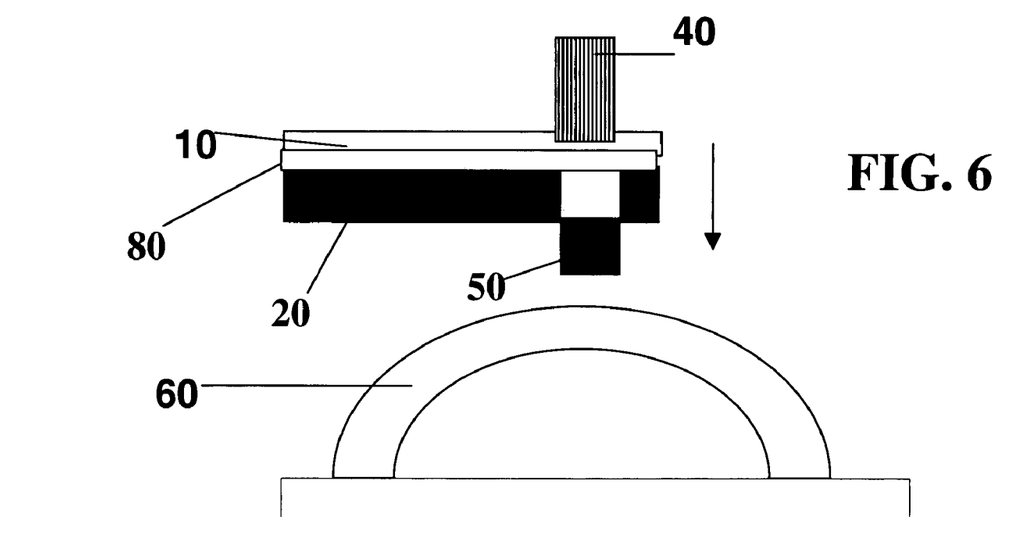
FIG. 6 is a side view schematic of one method of the present invention, wherein a single layer of material is transferred from a transparent substrate to a curved substrate using a dynamic release layer.
Figure 7:
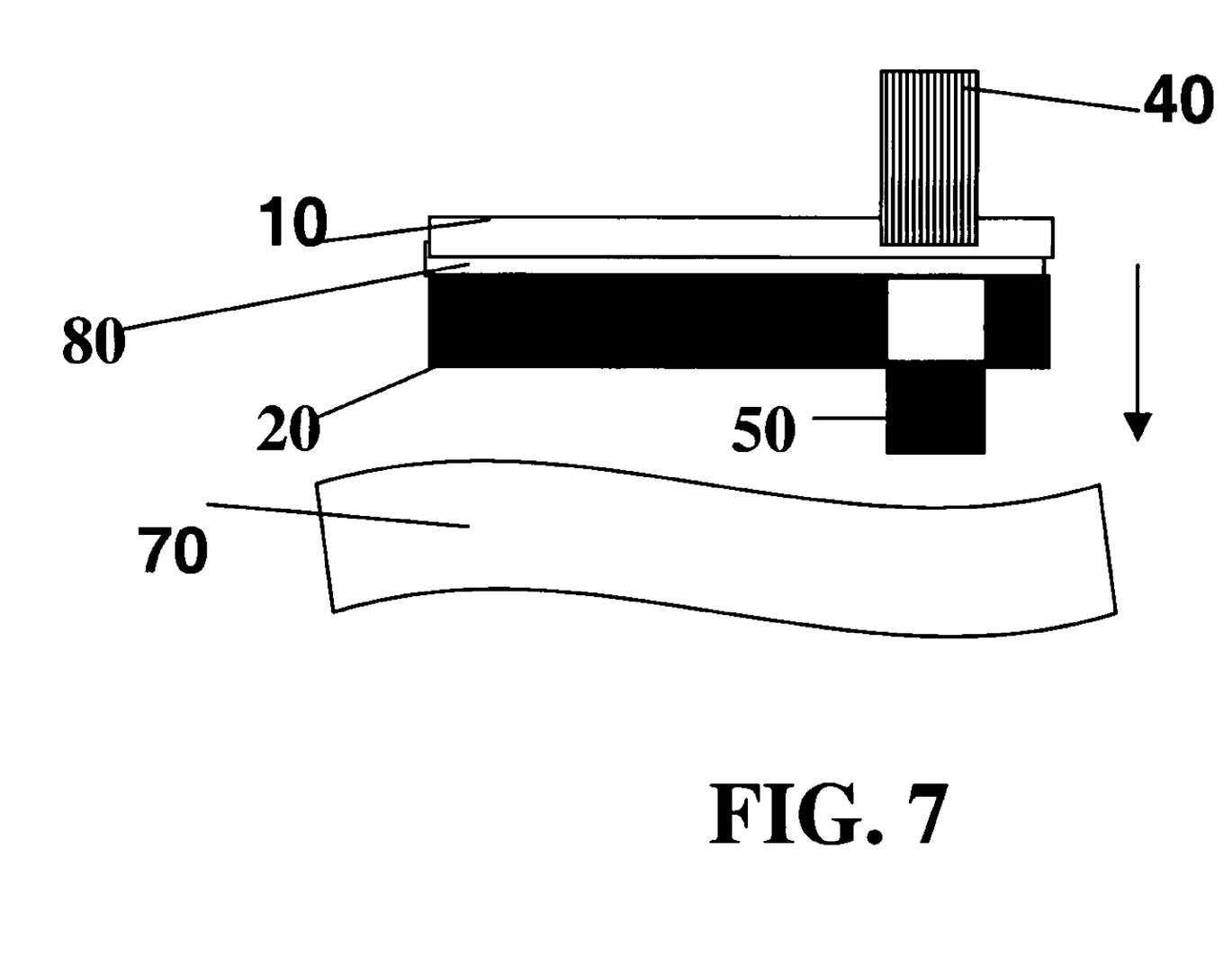
FIG. 7 is a side view schematic of one method of the present invention, wherein a single layer of material is transferred from a transparent substrate to a flexible substrate using a dynamic release layer.
Figure 8:
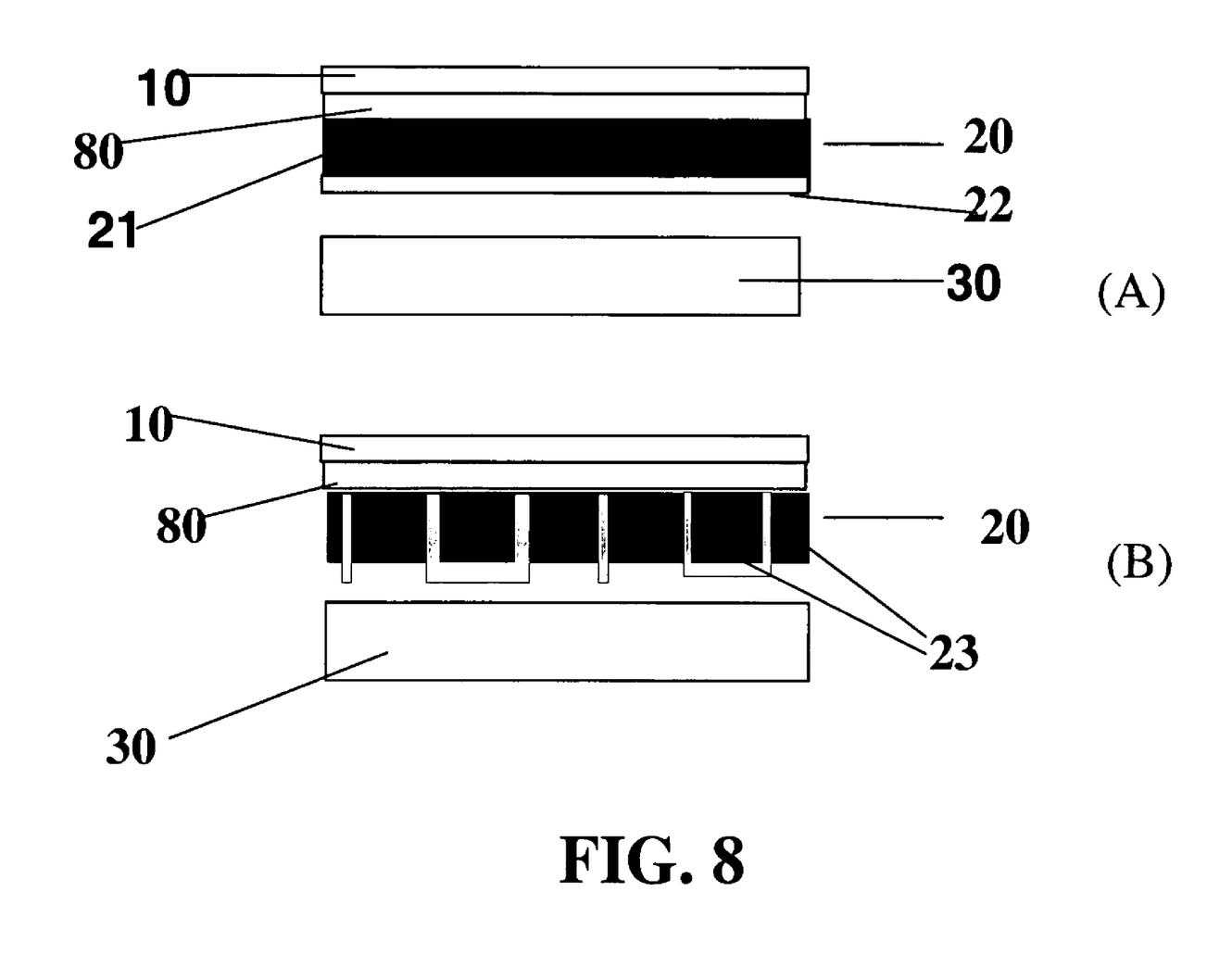
FIG. 8 is a side view schematic of one method of the present invention, wherein a dynamic release layer is interposed between the material to be transferred and the transparent substrate, wherein material to be transferred includes multiple layers (A) or includes isolated "tiles" or die (B).
Figure 9:
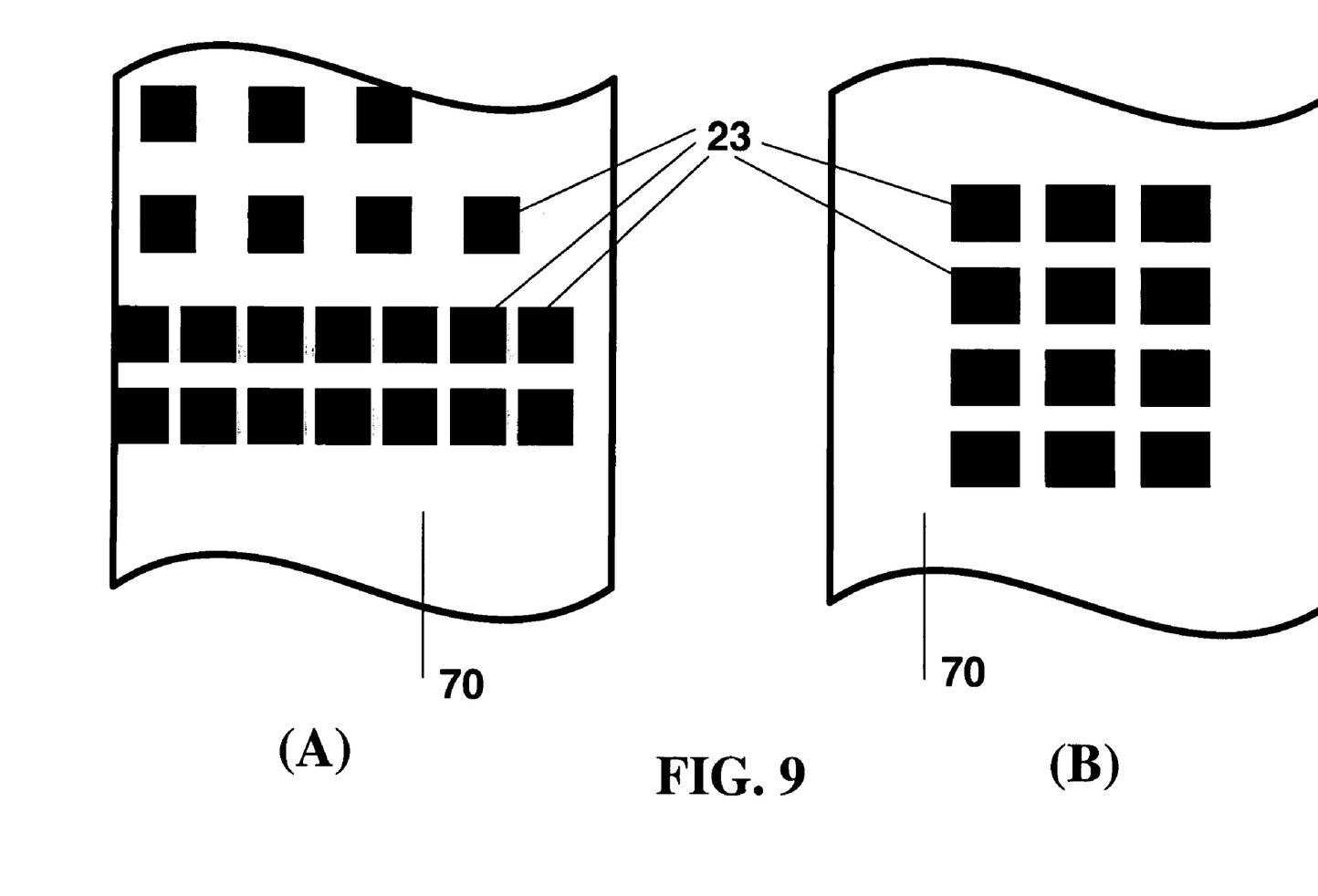
FIG. 9 is a top view schematic of two different designs of a multi-device component, such as transferred, millimeter-scale Si wafer tiles on a flexible polymer substrate, manufactured according to one method of the present invention.
Figure 10:
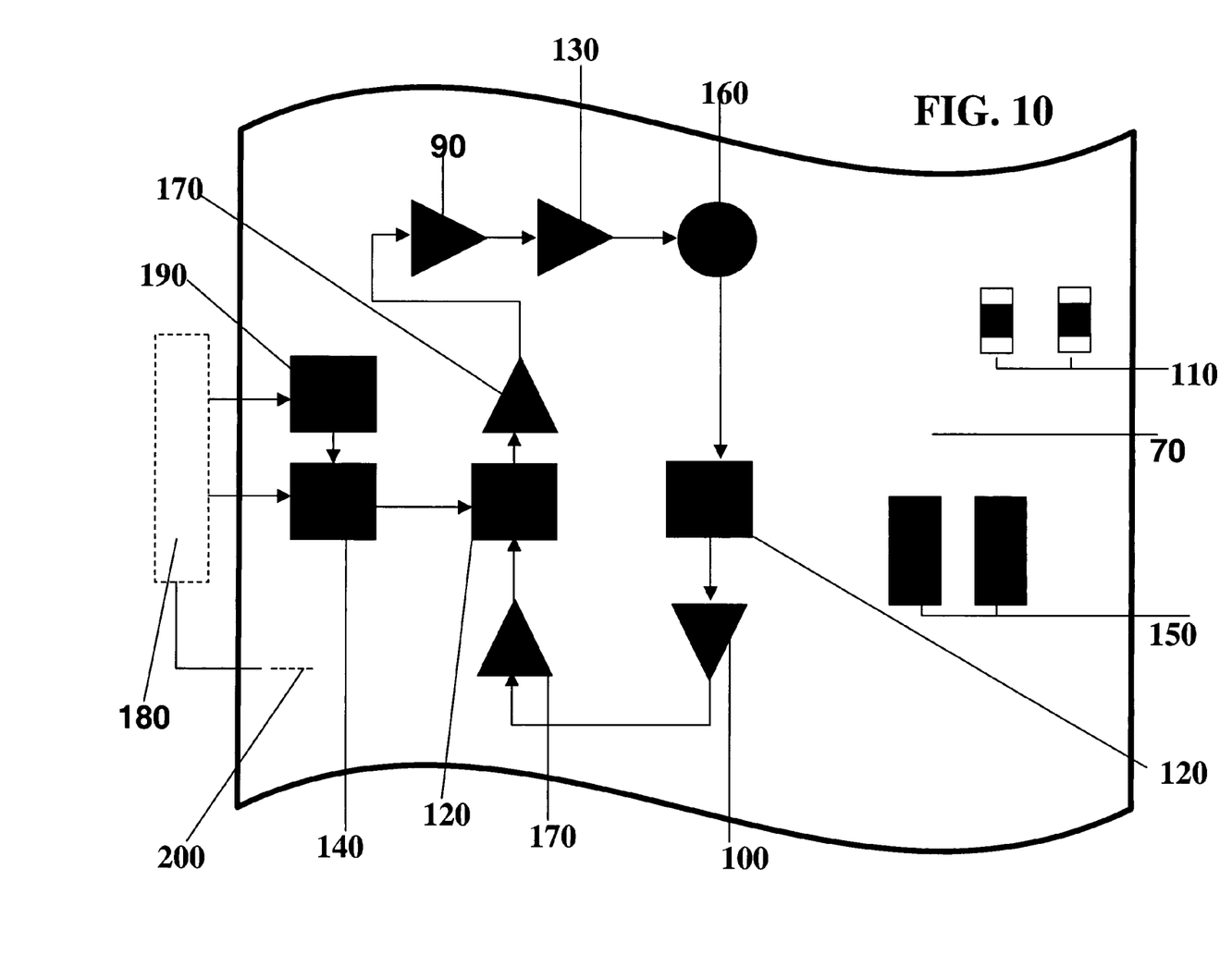
FIG. 10 is a top view schematic of a flexible transmit/receive (T/R) module manufactured using method embodiments of the present invention.

In addition to the several methods embodiments described herein, it is contemplated that a consumable intermediary product or a composite transfer sheet may be constructed for use in the laser transfer techniques, such as the composite transfer sheet illustrated in FIGS. 4 and 8. Such a consumable intermediary product may include any combination of the transfer substrate and a material to be transferred placed on the surface of the transfer substrate. Such a consumable intermediary product may or may not have a dynamic release layer and other adhesive materials. Such consumable intermediary products may comprise the transfer substrate 10 and the material to be transferred 20 as illustrated in FIG. 4 and may additionally include a dynamic release layer 80 as in FIG. 8. The transfer material 20 may be comprised of multiple layers 21 and 22 as seen in FIG. 4A, which may comprise one or more components to be transferred. The transfer material 20 may also be comprised of multiple singulated wafer tiles 23 as seen in FIG. 4B. A similar schematic is shown in FIG. 8A, wherein the multiple layers 21 and 22 contact a dynamic release layer 80. In FIG. 8B, the transfer material 20 is comprised of multiple wafer tiles 23 positioned on the dynamic release layer 80. As in the method embodiments, in the composite transfer sheets, the transfer material may directly contact the transfer substrate, may be an etched wafer placed on the transfer substrate, may be connected to the transfer substrate by an adhesive, may be one or more layers on the transfer substrate, or may be applied to one or more dynamic release layers coated on the transfer substrate.

The present methods may be used to manufacture a multi-device electronic component comprising a receiving substrate having one or more devices placed on it. For example, in FIG. 9, two different patterned multi-devices embodiments are displayed in A and B. Multiple millimeter-scale Si wafer tiles 23 may be transferred to a flexible polymer substrate 70 to create a multiple-device electronics. As another example, a transmit/receive module may be manufactured using the methods of the present invention, such as the one depicted in FIG. 10. Such a T/R module may comprise a driver amplifier 90, a low noise amplifier 100, resistors 110, T/R switches 120, power amplifier 130, phase shifter 140, and flat/conformal capacitors 150 on a flexible substrate 70. Other components of the depicted transmit/receive module include a circulator 160, a controller 180, an attenuator 190, and buffer amplifiers 170. The controller 180 attaches 200 to the T/R switches 130.

The invention may be used to manufacture a conformal phased array antenna system, consisting of radiating elements, a distribution network (i.e., the transmission lines) and low noise amplifiers, on or within a load bearing structure, such as an airframe, to maximize electronic and structural performance while minimizing the antenna system weight and volume. The load bearing structure may be curved, which necessitates a method of fabricating electronics on curved surfaces as embodied in the current invention.

An "electro-optical device" may be manufactured by using the methods of the present invention. An electro-optical device may include a display, such as a flat panel display for a personal computer, PDA, cell phone, or other device.

The transmission lines can be realized with microstrip lines, waveguides, or some combination of each. The radiating elements may be patches, slots, or a combination of the two. Both transmission lines and radiating elements can be fabricated by laser transfer of conductive materials such as copper in the desired pattern onto the load bearing structure.

The low noise amplifiers are circuits that can reduce the overall noise figure and increase the signal-to-noise ratio of the incoming signal. While integrating conventionally manufactured low noise amplifiers with load bearing structures may add surface-irregularities to otherwise-conformal surfaces, laser transfer can place discrete electronic devices such as low noise amplifiers conformally and cost-effectively onto the load bearing structure.

A variety of electronic devices, such as but not limited to transistors, resistors, capacitors, inductors, diodes, conductors, semiconductors, magnetic materials, dielectrics and combinations thereof, logic circuits, memory elements, sensor arrays, detectors, and other components, may be transferred to a substrate. Several laser transfer methods of the present invention may therefore: (1) avoid pick and place procedures; (2) avoid the added weight and bulk of device packaging; (3) make use of standard commercially available wafer materials; (4) make use of ambient processing conditions; (5) allow for the rapid, inexpensive, efficient transfer of pre-patterned and/or pre-fabricated devices onto a variety of receiving substrates.

Therefore, present laser transfer methods may be used to manufacture multi-device systems, such as communications hardware, displays, sensor systems, and complex flexible or curved circuitry. In this light, the laser transfer methods may be thought of as an "assembly" tool, bringing many parts together to form one new multi-device component.

This invention and embodiments illustrating the method and materials used may be further understood by reference to the following non-limiting examples.

EXAMPLE 1

This example illustrates transfer of silicon from a first substrate to a second substrate using embodiments of the method and apparatus of this invention. Two laser systems were used. Laser system A was an ESI model 44 laser trimming station. This system had a beam collimating optic that reduce the spot size by 50%. Laser B was an AB laser LBI6000 laser marking system (a multimode laser). Both systems used Q switched Nd:YAG lasers (fundamental). Power measurements were taken using an Ophia Orion TH power meter. Both laser systems had XY translation stages. On system A the Q switch was run at 100 Hz and the stage speed was set at 10 inch/min (6 mm/s) so that the spot separation would be 60 µm. For system B, the Q switch was fired at 100 Hz, but the translation speed was set at 1.2 inch/sec (30.5 mm/s) which would give a spot separation of 305 µm. For experiments 1-5, a 3M transparency film was used as the receiving substrate, for experiments 6-7 glass was the receiving substrate. The results of the runs are summarized in Table 1.

| # | Si film thickness/ μm | Laser System | Table speed/inch/min (mm/s) | Laser Current | Power/ Watts | Energy mJ/pulse | Measured Spot size/ μm |
|---|---|---|---|---|---|---|---|
| 1 | 0.1 | A | 10 (6) | 12.4 | 0.04 | 4 | 33 |
| 2 | 0.1 | A | 10 (6) | 15 | 0.12 | 12 | 41 |
| 3 | 0.1 | A | 10 (6) | 12 | 0.01 | 1 | 25 |
| 4 | 1.0 | A | 10 (6) | 12 | 0.02 | 2 | 25 |
| 5 | 1.0 | A | 10 (6) | 12.4 | 0.04 | 4 | 25 |
| 6 | 1.0 | B | 1.2 inch/sec | 20 | 0.3 | 30 | 230 |
| 7 | 1.0 | B | 1.2 inch/sec | 10 | .05 | 5 | 100 |

EXAMPLE 2

This example describes transferring silicon from a glass substrate to a second substrate. The maximum energy of a laser pulse that can pass through the donor substrate is first determined. This is a function of how much of the pulse energy is absorbed by the substrate. A substrate that may be used is a 4×0.06 inch soda lime glass substrate available from Nanofilm (LOT#0327033). A piece of this glass can be spectroscopically analyzed and undergo zap testing with pulsed YAG lasers at λ-1064 nm and λ-335 nm and if necessary at frequency doubled λ-532 nm to determine its absorption characteristics.

The substrates may be coated with 0.1 μm to about 50 μm of Si. These silicon films could be sandwiched with an uncoated substrate and a piece of transparency film using 3M Spray Mount artist's adhesive. Initially the spot size of the laser will be set as small as possible; ideally a 10-25 μm spot will be used and the size of the spot may be increased up to 100 μm.

The sandwich should be mounted on a translation stage set to travel at a speed such that it travels 1 mm/shot. The laser should be set at a low repetition rate, e.g. 10 Hz, so the stage should be set to 10 mm/s. Hence, a 4-inch slide would take about 10 seconds to scan. In the time it takes to traverse the slide, the laser power could be ramped from 50% to the maximum power the host substrate will withstand. The sandwich should be then translated by 1 mm in the y direction, the power increased by 10%, after which the stage and laser should again be set and operated as described above.

This procedure may be repeated using one spot size per sandwich (or run). This procedure may be repeated with a Si layer of various thickness using the information to determine the required laser and controller translation settings for Si laser transfer. Silicon that is transferred to the uncoated substrate may be evaluated by x-ray diffraction, TEM, and SEM analysis, among other techniques.

EXAMPLE 3

Thin, 20-μm-thick <100> silicon wafers were obtained from Virginia Semiconductor, Inc. (Fredericksburg, Va.) and mounted onto 0.090"-thick, 4"×4" square quartz plates for photopatterning. Universal Photonics Unibond 5.0 adhesive wax was applied at each wafer's periphery to hold the wafer in place on the quartz plate. Photoresist was coated onto each wafer by spin-coating, exposed through a photomask, and developed at Micrometrics, Inc. (Londonderry, N.H.). Plasma etching of the silicon wafers resulted in the formation of 1"×2" regions of 150-μm square silicon "mesas". Each mesa was separated from the others by >20-μm wide channels each ≧10 μm deep. These dimensions were measured by scanning electron microscopy at Severn Trent Laboratories (Billerica, Mass.). The photopatterning process resulted in a 20-30% yield of 150-μm silicon squares. Thus patterned, each silicon wafer was then covered over with a 0.060"-thick, 4"×4" soda lime glass substrate, leaving the etched wafers "sandwiched" between quartz and soda lime plates. Individual 150-μm silicon mesas were transferred from the quartz substrate to the soda lime plate using an AB Marking Laser at Laser Services, Inc. (Westford, Mass.). To achieve transfer the laser spot, (beam spot size, FWHM=115 microns; single pulse of 3.6 mJ; duration=18 ns at the fundamental Nd:YAG wavelength 1064 nm) was positioned at roughly the center of each silicon mesa, and single laser pulses passed through a 1-mm aperture were used to transfer individual mesas. Transfer occurred when the current setting on the laser was adjusted to 14.5-15 amps. Higher laser current settings resulted in vaporization of the 150-μm mesas on irradiation, rather than transfer.

EXAMPLE 4

This example illustrates fabrication of a flexible, multi-device transmit/receive (T/R) communications module utilizing the methods of the present invention. A non-singulated GaAs wafer patterned with power amplifiers is obtained from MIA-Com. Each aluminum contact pad on the wafer is coated with conductive diamond particles by Scimaxx Solutions, LLC, and the wafer is coated with a thin film of adhesive. Next, the wafer is mounted on a dynamic release layer-coated transparent substrate (e.g., a glass plate) using a thin layer of adhesive. The individual power amplifiers are then singulated by chemical, plasma, or laser etching, shallow mechanical sawing, or other method through the thickness of the wafer.

The diced wafer is loaded onto a flat platen, with an opening in the platen through which the laser beam used for device transfer can impinge on the die from the underside. The etched wafer is rotatable on the platen, such that a different region of the wafer is exposed to the laser through the platen opening as the wafer rotates.

A flexible Kapton® (a polyimide film available from DuPont) ribbon on a reel-to-reel winding system is brought into contact with the adhesive-coated die (i.e., the Kapton® is brought down on top of the wafer). Contact is made with the wafer in the vicinity of the platen opening. Electrically-conductive traces have been printed onto the Kapton® ribbon using the methods of the present invention. Terminating contact pads on these traces are aligned with the contact pads of at least one power amplifier for which laser transfer is desired.

To achieve transfer, a beam from a pulsed Nd:YAG laser source is directed through the opening in the platen and the transparent substrate, and momentarily impinges on the dynamic release layer underneath one of the singulated power amplifiers. The intensity of the beam is sufficient to cause release of the power amplifier from the DRL-coated substrate.

Both the wafer and the Kapton® ribbon spool are then rotated, physically separating the transferred power amplifier from the wafer. The power amplifier remains physically adhered to and in electrical contact with the Kapton® contact pads. This transferred device may be further processed downstream of the laser transfer step (e.g., coated with a "glob top" encapsulant). Prior to rotating the wafer and the Kapton® ribbon spool, additional devices (phase shifters, low-noise amplifiers, switches, etc.) may be transferred to the Kapton in the same manner, completing the T/R module. Rotating the wafer brings new devices into contact with other sets of Kapton® contact pads, and the laser transfer process described above is repeated. The beam may again be repositioned so as to cause transfer of these "new" devices, or may again be directed at its last location, as a different device has rotated into this position and may be transferred without redirecting the beam.

Although the present invention has been described in considerable detail with reference to certain preferred embodiments thereof, other versions are possible. Therefore the spirit and scope of the appended claims should not be limited to the description and the preferred versions contained within this specification.

What is claimed is:

1. An electronic component comprising a receiving substrate having one or more devices placed thereon, wherein at least one device is transferred to the receiving substrate by a transfer process comprising:
   providing a transfer substrate having one or more devices disposed thereon;
   providing the receiving substrate; and
   exposing the transfer substrate to the energy beam at a defined location on a device, wherein energy from the energy beam is transferred to the device which releases the device from the transfer substrate at a point of energy impingement and physically transfers the device from the transfer substrate to the receiving substrate.

2. The electronic component of claim 1, wherein the electronic component comprises a sensor device, an electro-optical device, a communications device, a transmit-receive module, and a phased array.

3. The electronic component of claim 1, wherein the receiving substrate is selected from the group consisting of rigid, flexible, curved, both flexible and curved, and both rigid and curved materials.

4. The electronic component of claim 1, wherein the transfer substrate is a transparent material.

5. The electronic component of claim 1, wherein the transfer substrate is a polyimide ribbon film.

6. The electronic component of claim 1, wherein the receiving substrate is a material selected from the group consisting of polymers, glass, hybrids of polymers and glass, polymer composites, stainless steel, metallic foils, ceramics and woven materials.

7. The electronic component of claim 1, wherein the receiving substrate comprises a polysiloxane, polyalkylene, polyarylene, polyurethane, polyamide, polyacetylene, epoxy, liquid crystal polymer, amino plastic, polysulfide, polyester, polyether, polycarbonate, polyacrylate, polysulfone, polyimide, or composites or copolymers or combinations thereof.

8. The electronic component of claim 1, further comprising an adhesive layer interposed between the one or more device and the transfer substrate.

9. The electronic component of claim 1, further comprising one or more dynamic release layers interposed between the transfer material and the transfer substrate.

10. The electronic component of claim 9, wherein the one or more dynamic release layers comprise a material selected from the group consisting of organic materials, thin metal films, metal oxides, metal sulfides, polymers, metal alloys, and mixtures thereof.

11. The electronic component of claim 9, wherein the one or more dynamic release layers comprise a metal selected from the group consisting of metal phthalocyanines, metal dithiolenes, metal anthraquinones, a metal of Groups Ib, IIb, IIIa, IVa, IVb, Va, Vb, VIa, VIb,VIIb or VIII of the Periodic Table, alloys of said metals, oxides of said metals, sulfides of said metals, and mixtures thereof.

12. The electronic component of claim 9, wherein the one or more dynamic release layers comprise a material selected from the group consisting of polythiophene, polyaniline, polyacetylene polyphenylene, polyphenylene sulfide, polypyrrole, derivatives thereof, and mixtures thereof.

13. The electronic component of claim 1, wherein the one or more devices comprise components selected from pre-formed electronic devices, magnetic material, crystalline material and a combination thereof.

14. The electronic component, of claim 13, wherein the at least one pre-formedelectronic device is selected from at least one transistor, at least one resistor, at least one capacitor, at least one diode, at least one semiconductor, at least one inductor, at least one conductor, at least one dielectric, and a combination thereof.

15. The electronic component of claim 1, further comprising the step of exposing the receiving substrate to an energy beam.

16. The electronic component of claim 15, wherein exposing the receiving substrate to an energy beam results in a roughening of a surface of the receiving substrate, a modification of the composition or properties of a surface of the receiving substrate, or a combination thereof.

17. The electronic component of claim 15, wherein exposing the receiving substrate to an energy beam results in a modification of the composition or properties of a material deposited on the receiving substrate.

* * * * *